United States Patent
Bald et al.

(10) Patent No.: US 6,538,420 B2
(45) Date of Patent: Mar. 25, 2003

(54) AUTOMATED RUN TEST SYSTEM HAVING BUILT-IN HIGH VOLTAGE SWITCHING MATRIX FOR INTERCONNECTION TO A SAFETY COMPLIANCE TESTING INSTRUMENT

(75) Inventors: Roger A. Bald, Round Lake Beach, IL (US); Pin-Yi Chen, Taipei (TW)

(73) Assignee: Associated Research, Inc., Lake Forest, IL (US)

( * ) Notice: Subject to any disclaimer, the term of this patent is extended or adjusted under 35 U.S.C. 154(b) by 52 days.

(21) Appl. No.: 09/828,956

(22) Filed: Apr. 10, 2001

(65) Prior Publication Data

US 2002/0145435 A1 Oct. 10, 2002

(51) Int. Cl.[7] .......................... G01R 31/02; H01H 31/02
(52) U.S. Cl. ........................................ 324/114; 324/555
(58) Field of Search ................................ 324/551, 763, 324/537, 759, 555, 522, 750, 755, 121 R, 115, 114; 702/121, 511, 510, 572

(56) References Cited

U.S. PATENT DOCUMENTS

| | | | | |
|---|---|---|---|---|
| 3,836,854 A | * | 9/1974 | Wehman | 324/133 |
| 5,347,224 A | * | 9/1994 | Brokaw | 324/126 |
| 5,640,154 A | * | 6/1997 | Meyer et al. | 324/544 |
| 5,652,521 A | * | 7/1997 | Meyer | 324/541 |
| 5,652,526 A | * | 7/1997 | Sullivan et al. | 318/490 |
| 6,011,398 A | * | 1/2000 | Bald et al. | 324/508 |
| 6,177,803 B1 | * | 1/2001 | Train et al. | 324/551 |

* cited by examiner

Primary Examiner—Christine Oda
Assistant Examiner—John Teresinski
(74) Attorney, Agent, or Firm—Bacon & Thomas

(57) ABSTRACT

An electrical run test instrument having a connection to a device under test includes a line voltage input, a high voltage input, and a high voltage switching matrix that enables selective connections between the device under test and line voltage or high voltage inputs using the same test set-up. The high voltage input may be interconnected with a safety compliance test instrument, permitting both run tests and line tests to be performed in succession using the same basic connection to the device under test.

8 Claims, 9 Drawing Sheets

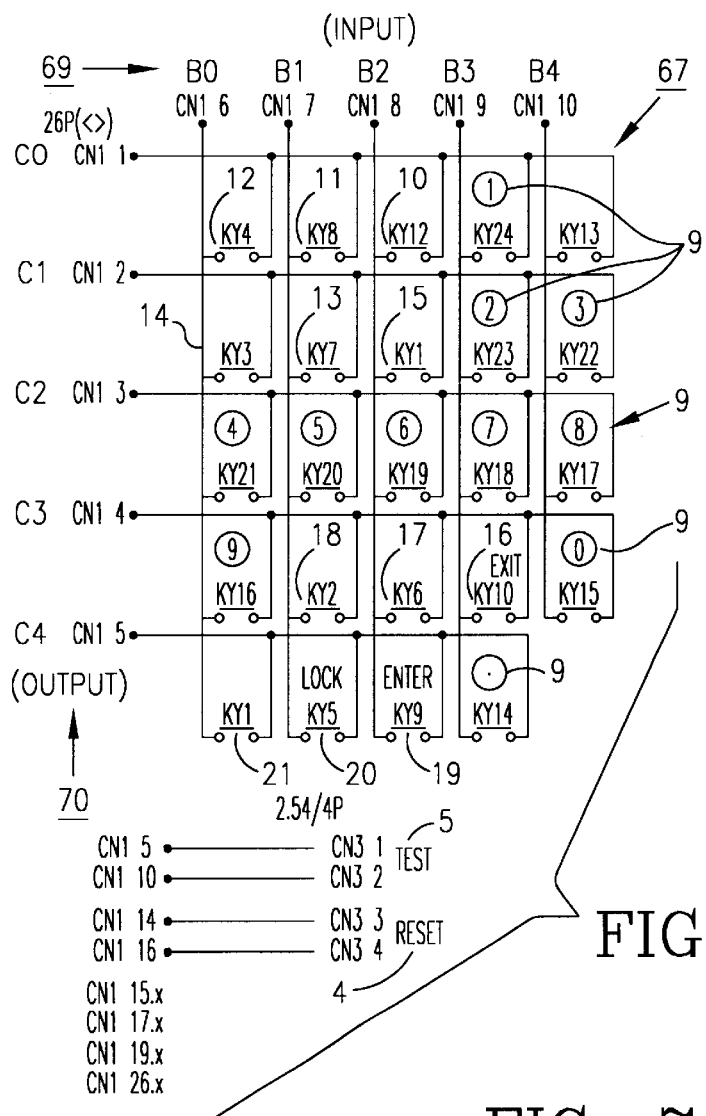
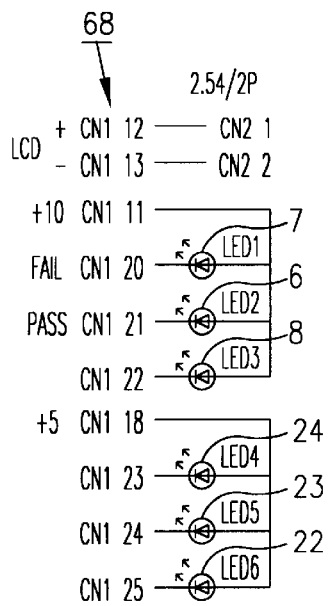
FIG. 6
FIG. 5
FIG. 7
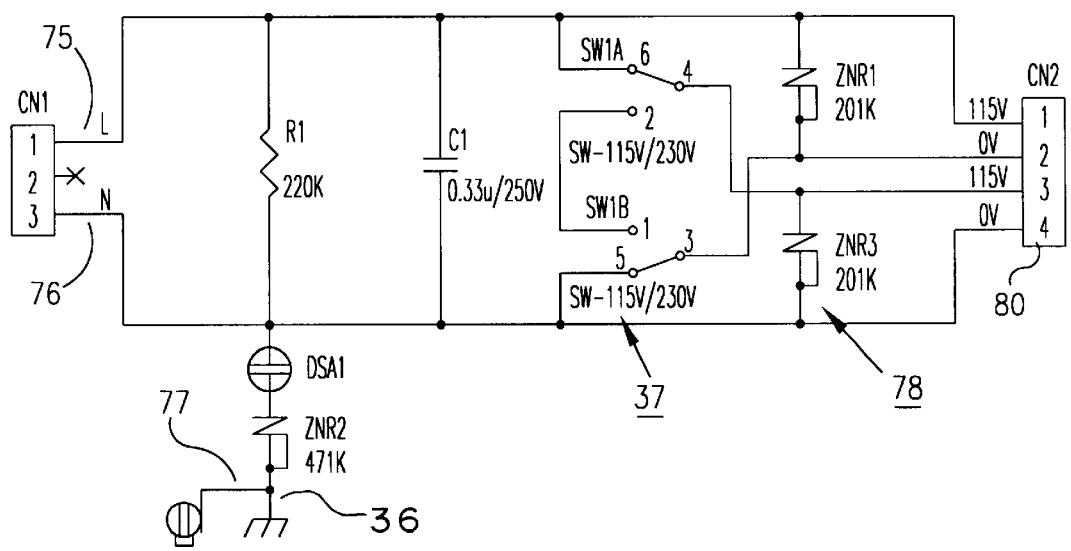

AUTOMATED RUN TEST SYSTEM HAVING BUILT-IN HIGH VOLTAGE SWITCHING MATRIX FOR INTERCONNECTION TO A SAFETY COMPLIANCE TESTING INSTRUMENT

BACKGROUND OF THE INVENTION

1. Field of the Invention

The present invention relates to an electrical test instrument, and in particular to an electrical run test instrument of the type used to test an electrical product or device by running the product or device at its normal operating voltages and currents.

The run test instrument of the invention includes a switching matrix that enables the run test instrument to be interconnected with at least one external safety compliance test instrument so as to enable testing of the product at other than operating voltages and currents without having to disconnect the product from its initial connection to the run test instrument, and that further includes line leakage test capabilities. Safety compliance test instruments to which the run test instrument of the invention may be connected include instruments capable of performing dielectric withstand, insulation resistance, and ground bond tests, as well as multiple function test instruments capable of performing multiple different types of safety compliance tests.

2. Description of Related Art

The present invention is a run test instrument designed to be interconnected with a safety compliance instrument in order to simplify design of test sequences that include not only run tests but also safety compliance tests such as dielectric withstand, insulation resistance, and ground bond tests using a single test setup.

Run tests and safety compliance tests have traditionally been treated as completely separate types of tests. Safety compliance testing involves testing the performance of a product to determine risk of injury to persons or property by subjecting the product to stress resulting from high voltages or currents, while run testing involves testing the performance of the product at ordinary operating or line voltages and currents. Despite the differences, however, both run testing and safety compliance testing are now considered integral parts of design and manufacturing processes for a wide variety of electrical products, and a convenient way of integrating the two types of tests would, in many situations, significantly improve the efficiency of those processes.

One of the reasons that run testing and safety compliance testing have traditionally not been combined is that there are simply too many different types of safety compliance tests to combine them all into a single test instrument. Even though integration of different test instruments offers the advantage of convenience and, to an extent, cost savings, integration has the disadvantage that not all of the different types of safety compliance tests need to be performed on every product, and therefore manufacturers and testing agencies have tended to forego complete integration in favor of being able to purchase only those test instruments required for their particular product.

By way of background, descriptions of various types of safety compliance tests may be found in U.S. Pat. Nos. 6,011,398 and 6,054,865, which respectively disclose a line leakage tester and a multiple function dielectric withstand tester capable of performing insulation resistance and ground bond tests in addition to various types of dielectric withstand tests. The detailed descriptions in these patents illustrate the diversity of safety compliance tests that currently must be performed in various situations. For example, line leakage safety compliance testing is primarily used during development of a product to verify whether a design is safe by simulating possible problems which could occur if the product is faulted or misused while the product is operating under high line conditions (110% of the highest input voltage rating of the product), and measuring the amount of current to which a user of an electrical device is exposed. On the other hand, insulation resistance tests are used during design of a product to measure circuit-to-ground impedance by measuring leakage current when a nondestructive voltage (in general, lower than 1000 volts) is applied between the circuit and ground, while dielectric withstand or "hipot" safety compliance tests may be required either during design or manufacturing to measure insulation integrity by subjecting a device to voltages substantially greater than those applied during normal operation (in general, twice the normal operating voltage, plus 1000 volts), and measuring all stray current. Finally, ground bond tests are used during design or manufacturing to measure the response of the ground circuit to potential fault currents that might result from defective insulation.

Run testing, in contrast, is carried out after final safety testing so that manufacturers can verify the functionality of their products, and to gather basic test data on the products. A run test system ideally allows the product to be powered up immediately after the safety tests are completed in order to measure Amperage, Voltage, Watts, and Power Factor by replacing conventional electrical test instruments such as voltmeters and ammeters with a single instrument that provides a more convenient connection to the product being tested, and an integrated control interface.

The present invention seeks to provide a more integrated test system that permits both run tests and safety compliance tests to be performed through a single test set-up, while still offering the advantage of modularity or separability so that the run test and safety compliance instruments can be purchased and used separately or together as situations warrant. The approach taken by the present invention is to integrate a line leakage test capability, and to offer other safety compliance test capabilities through an interface capable of accepting voltages and currents from various safety compliance instruments and supplying them through the run test connection to the product being tested, thereby maintaining the discrete nature of the run and safety compliance test instruments.

In a sense, the use of an appropriate interface to permit integrations of test capabilities while still providing separate instruments is a departure from the historical trend toward greater integration of test capabilities in a single instrument. For example, specific examples of prior test instruments that include both run testing and high voltage safety compliance testing features have in fact been disclosed in U.S. Pat. Nos. 3,368,146, 4,922,172, 5,568,058, and 5,652,526. Instead of providing a switching interface that connects separate instruments, however, each of the devices disclosed in these patents is an integral unit, with no provision for interconnectability.

The present invention, in contrast, does not attempt to completely integrate run test and safety compliance test instruments, but rather builds upon previous attempts to provide safety compliance testers with varying degrees of interconnectability, ranging from completely modular rack based systems, such as the ones disclosed in U.S. Pat. Nos. 4,402,055, 4,760,330, 4,763,124, 4,807,161, and 5,036,479 which utilize a common bus, central controller, and plug-in units, to fully automated integrated test instruments with GPIB interfaces for integrated or common control of line leakage and dielectric withstand tests. What distinguishes the invention from the modular systems disclosed in the inclusion of interconnection capabilities in a run test instrument, rather than just in a safety compliance test instrument, and in the specific manner in which the interconnectability is accomplished, through the use of a high voltage switching matrix rather than a purely modular, bus or backplane interconnected system.

By providing for interconnection of a run tester with safety compliance test instruments, so that the run testing set up can also be used for connecting the device under test to the safety compliance tester in order to simplify production testing, and to enable safety compliance tests to easily be added to a run testing routine, the invention facilitates implementation of a product testing system such as the one described in U.S. Pat. No. 6,038,521. In the system described in this patent, both run testing and safety compliance testing is used to provide a "quality test system for electrical appliances," but the quality test system uses separate run testing and safety compliance test equipment, with no interconnectability between the separate test instruments. By enabling more convenient implementation of run tests and safety compliance tests, the invention offers significant improvements in design and manufacturing efficiency to the user of a system such as the one described in U.S. Pat. No. 6,038,521, which should ultimately result in improved product safety for all consumers.

SUMMARY OF THE INVENTION

It is a first objective of the invention to provide a product testing system that allows both run tests and safety compliance tests to be performed using a single connection to the product being tested, while still offering the advantage of separability or modularity.

It is a second objective of the invention to provide a run test instrument capable of being interconnected to various electrical safety compliance testers in order to provide a product testing system that allows tests to be performed by applying higher than normal voltages and currents to a product, and then running the product on line power, while using a single connection to the product.

It is a third objective of the invention to provide a run test instrument that:
  is capable of measuring input voltage, amperage, power, and power factor of a product running on line current,
  is capable of accurately measuring leakage current from the enclosure of the product being tested to the neutral of the input power,
  includes improved display, set up, and calibration features, and
  can be used as part of an integrated run test instrument that can interconnect to an electrical safety compliance tester.

These objectives are achieved, in accordance with the principles of a preferred embodiment of the invention, by providing an electrical test instrument having a connection to a product being tested or "device under test" (DUT), and that further includes a high voltage switching matrix and a high voltage input that enables connection of the test instrument to an external high voltage safety compliance device through the above-mentioned connection to the device under test.

Preferably, the inputs to the high voltage switching matrix of the preferred test instrument include at least a line voltage input, a line neutral input, a high voltage input, a ground bond/continuity input, and a high voltage/ground bond return, while the outputs from the high voltage switching matrix include a DUT line output, a DUT neutral output, an earth ground connection, and a connection to the DUT case or chassis, as well as taps for measuring input voltage, output voltage, and output current and for supplying the measurement results to analog-to-digital and comparison circuitry on a main control board for display or further processing. Switching between the various inputs and outputs is accomplished through the use of relays controlled by a processor on the main control board.

In addition to including a high voltage switching matrix that makes possible interconnection to an external safety compliance test instrument, the run test instrument of the preferred embodiment is capable of measuring input voltage, amperage, power, and power factor of a product running on line current, and also of accurately measuring leakage current from the enclosure of the product being tested to the neutral of the input power.

Additional features of the run test instrument of the preferred embodiment of the invention, which are shared by the safety compliance test instrument disclosed in U.S. Pat. No. 6,054,865, herein incorporated by reference, are an operator interface arranged to permit test parameters to be pre-programmed or set through a keypad accessible to a user of the instrument and a menu driven display screen, and a remote interface that permits pre-programmed test functions to be initiated through a remote input port, and pass/fail indicator functions to be reviewed via a remote output port in order to enable manual control of the instrument from a remote location.

BRIEF DESCRIPTION OF THE DRAWINGS

FIG. 5 is a schematic circuit diagram showing details of the keypad circuit board shown in FIG. 3.

FIG. 6 is a schematic circuit diagram showing details of the LED display board shown in FIG. 3.

FIG. 7 is a schematic circuit diagram of an input protection board for use in the preferred run test instrument.

DETAILED DESCRIPTION OF THE PREFERRED EMBODIMENTS

Figure 1:
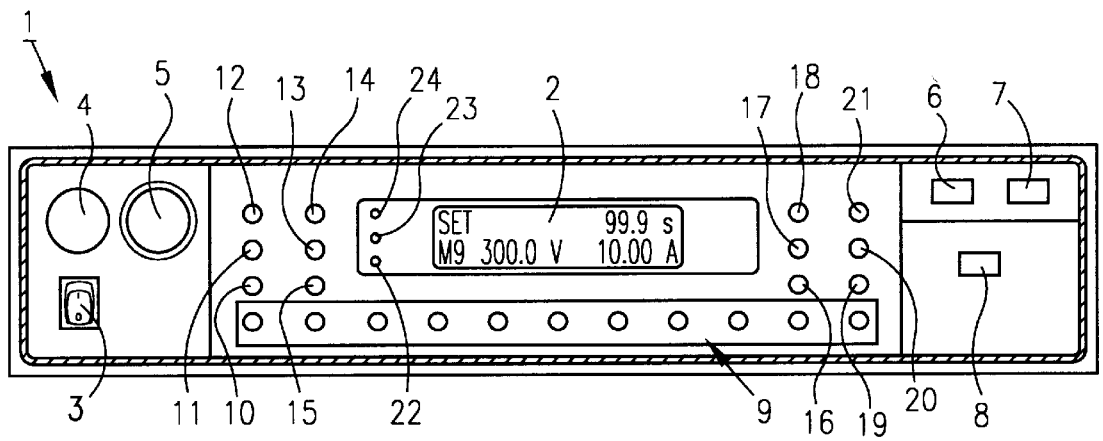
FIG. 1 is an elevation showing the front panel of a run test instrument constructed in accordance with the principles of a preferred embodiment of the invention.
Figure 2:
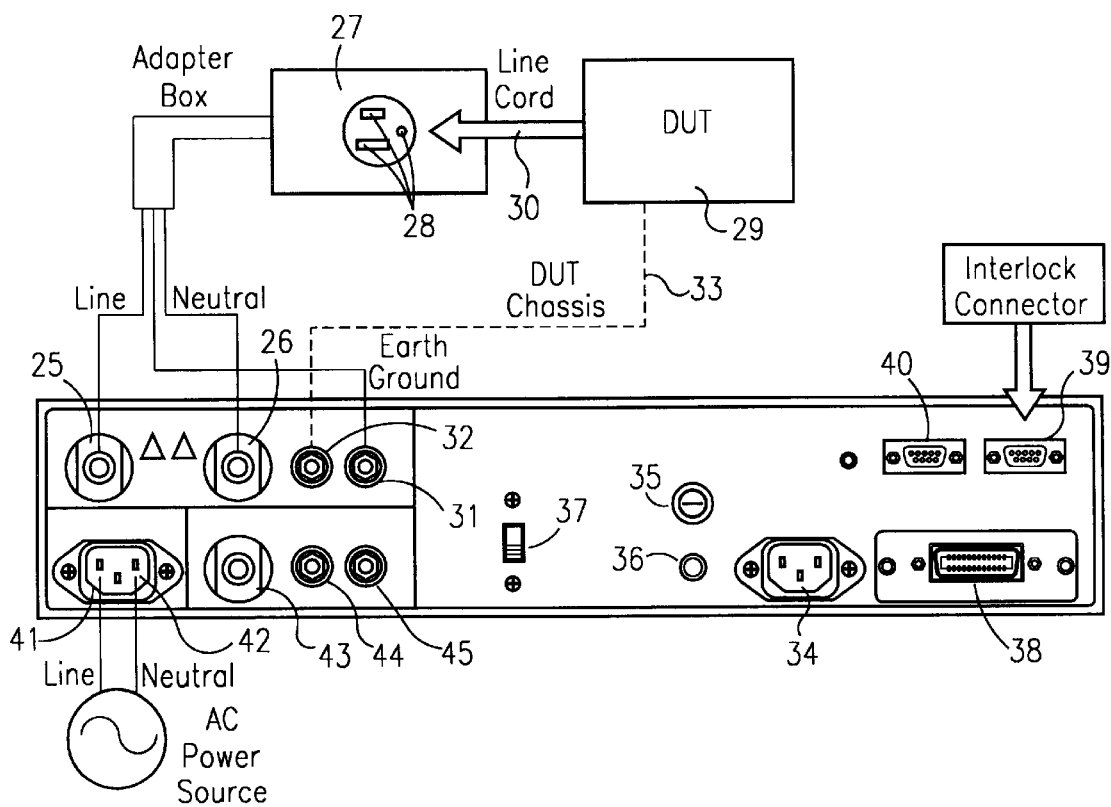
FIG. 2 is a partially schematic view including an elevation of the rear panel of the run test instrument of the preferred embodiment of the invention, together with connections to a device under test.
Figure 3:
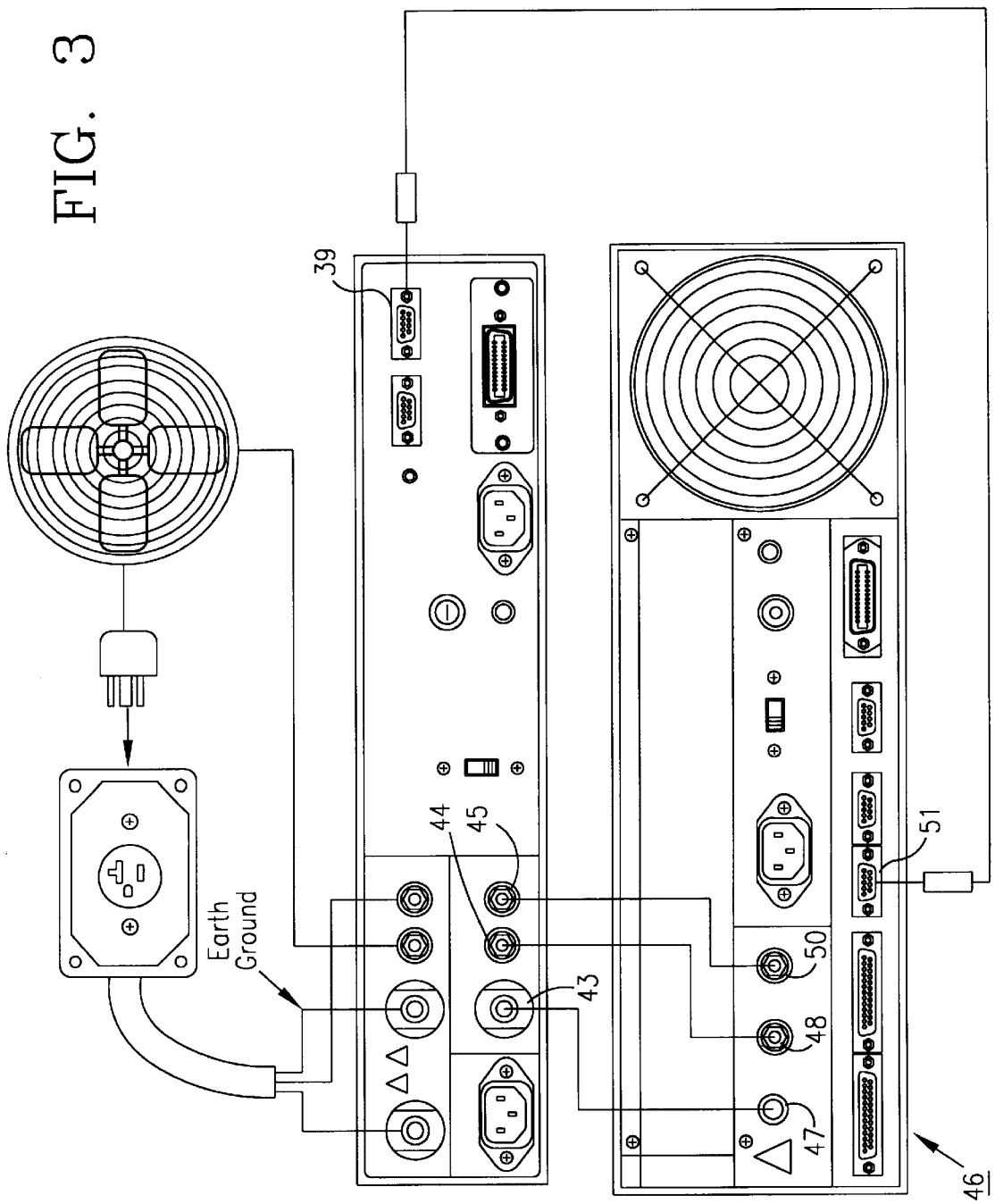
FIG. 3 is a partially schematic view of the rear panel of the dielectric withstand tester disclosed in U.S. Pat. No. 6,054,865, and of connections between the front panel of the preferred run test instrument and the rear panel of the dielectric withstand tester.
Figure 4:
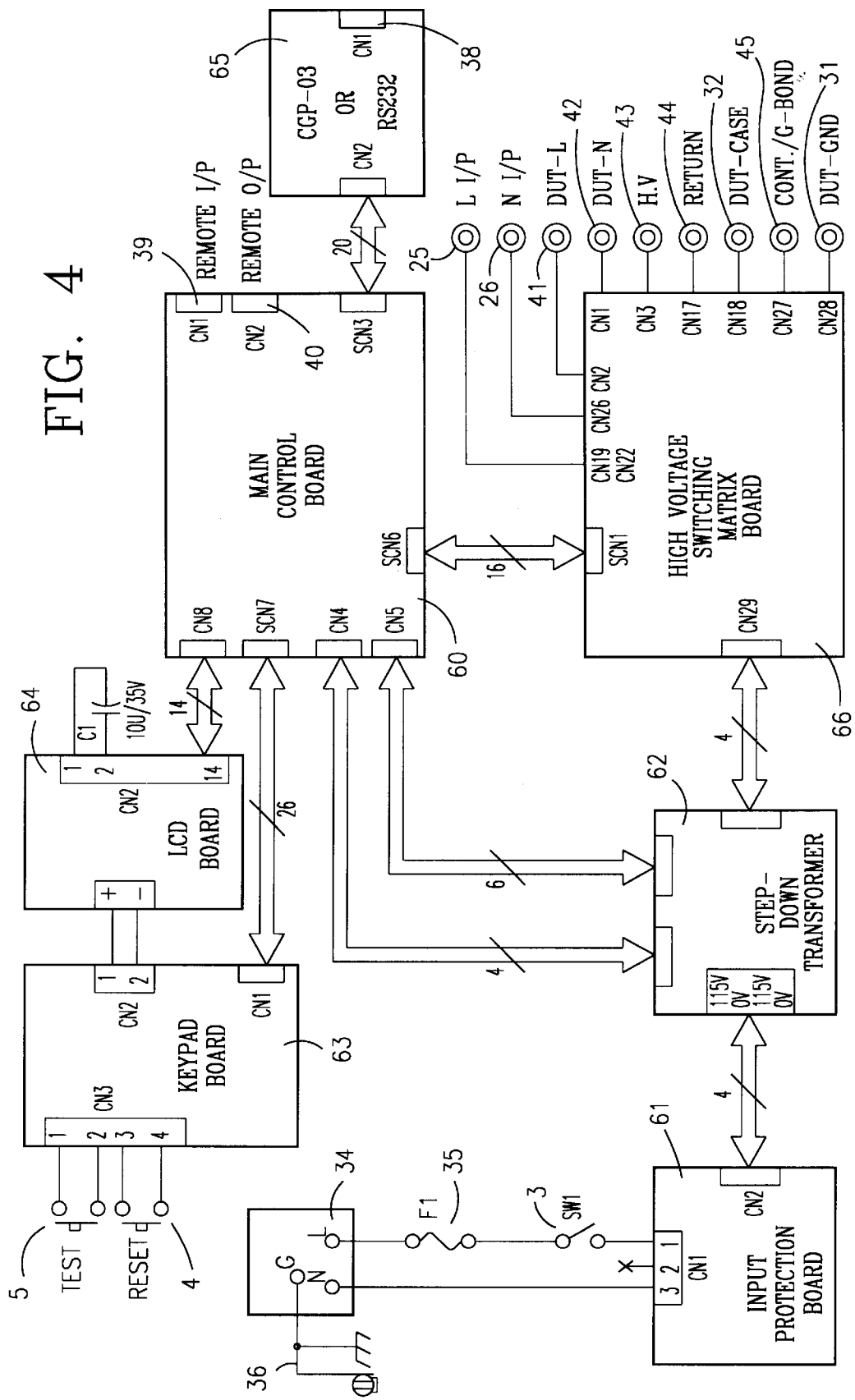
FIG. 4 is a block diagram showing power and control circuitry for the run test instrument of the preferred embodiment of the invention.

FIGS. 1 and 2 illustrate preferred layouts of the front and rear panels for the run test instrument of the preferred embodiment of the invention. As illustrated, the front and rear panels respectively provide an operator interface through which test parameters and sequences are controlled, and a test interface for connecting the run tester to a device to be tested. FIG. 3 illustrates the manner in which the run test instrument of the preferred embodiment is connected to a DUT and to an external safety compliance test instrument, FIG. 4 illustrates the overall circuit board layout for the run test instrument of the preferred embodiment, and FIGS. 5–12 show examples of specific implementations of the circuitry illustrated in FIG. 4.

While specific implementations of the circuitry of the preferred run test instrument are illustrated in detail below, it will be appreciated by those skilled in the art that the drawings contain numerous elements which are not part of the invention, but rather are included for completeness and to show the best mode of practicing the invention. For example, each of the integrated circuits shown in the drawings is identified by a part number which can be used to obtain the integrated circuit from manufacturers, using catalogs available from various integrated circuit makers as well as directories such as the "Chip Directory" available on the Internet at the hypertext transfer protocol site [www] .acl.co.uk. Although included in the illustrated embodiment, these integrated circuits are in general equivalent to other integrated circuits which perform similar functions, and substitution of these circuits, as well as the corresponding power supply and input/output circuits, is intended to be within the scope of the invention. In fact, since in its broadest form the invention relates not to the run test instrument by itself, but to connectability of different electrical test instruments, even the functions of the preferred run test instrument should not necessarily be taken as limiting.

Because the specific functions of the individual resistors, diodes, op amps, and other illustrated circuit elements are in general apparent from the illustrations and will be readily understood by those skilled in the art; detailed explanations of individual circuit elements are only given with respect to those elements or combinations of elements that specifically illustrate or implement the principles of the invention and that have functions other than routine bias, filtering, and similar functions.

As shown in FIG. 1, the front panel 1 of the preferred run tester includes an LCD display screen 2 for displaying test results and menus used to select or program test parameters, an on/off main power switch 3, an illuminated reset button 4 for aborting a test or shutting off the alarm in case of a test failure and for signaling that the operator is aware of the failure and is ready to proceed with the next test or a change of parameters, an illuminated test button 5 for activating a test that is set up in the memory location shown on the display, and various additional keys or buttons, described in more detail below, for setting up and running tests, and for enabling entry of test parameters based on the displayed menus. Also included on the front panel are an LED 6 which illuminates when the DUT passes a test, an LED 7 which illuminates when the DUT fails a test, and an LED 8 which illustrates when the DUT has a voltage applied to it and a run test is being carried out.

The additional keys or buttons include, in the illustrated example, numeric keys 9, and various toggles switches used to set parameters for different run tests, including a leakage button 10, power button 11, voltage button 12, power factor button 13, and current button 14 for toggling between low and high set points in order to permit entry of, respectively: acceptable leakage values; power levels; voltages; power factors; and currents via the numeric keys 9. Also included is a timer button 15 for toggling between a delay timer, dwell timer, and connect memory mode in order to permit entry of the appropriate delay and dwell time values, as well for selection of a connect memory mode which links test programs. Finally, the front panel includes an exit key 16 used to clear numeric information from a test parameter and exit a test setup to enter the run mode, a local button 17 which enables switching back from bus remote to local operation of the test instrument, a display button 18 which enables toggling between different LCD display screens, an enter key 19 for saving newly entered data and for toggling between off and on functions, a lock key 20 for entering a security lock menu, and a setup key 21 for entering miscellaneous data in response to menu prompts.

Additional indicators, positioned adjacent the LCD display 2, include an LED 22 for indicating that the instrument has been locked in order to prevent a user from changing settings for a particular program without entering a password, an LED 23 which indicates that the test instrument is being controlled through a 9-pin D-sub connector at the rear of the test instrument, and an LED 24 which indicates control of the instrument through a GPIB or RS-232 interface bus.

The rear panel of the preferred test instrument, illustrated in FIG. 2 includes a line output 25 and a neutral output 26 for connection to an adapter box 27 having appropriately shaped contacts 28 for insertion of the tines of a plug extending from or connected to the DUT 29 via a schematically illustrated line cord 30, as well as an earth ground connection 31 and a terminal 32 for connection of a chassis probe or lead, indicated schematically by line 33. In addition, the rear panel includes an AC line input power receptacle 34 for supplying power to operate the run test instrument, a fuse receptacle 35, a chassis ground terminal 36, and a 115V/230V selector switch 37. Remote control of the run tester may be carried out though a GPIB or RS-232 bus interface 38, or by a 9-Pin D-sub female connector input 39 arranged to receive signals remotely controlling the test, reset, and interlock functions, as well as program memory selection, and a 9-Pin D-sub male connector output 40 arranged to relay pass, fail, and processing signals to the remote instrument. The interlock function disables front panel controls on the run tester, with the exception of the reset button, when the tester is being remotely controlled.

Uniquely, the rear panel of the run test instrument of the preferred embodiment of the invention further includes not only a line input receptacle including a line input 41 and a neutral input 42 for supplying 115/230VAC power to the DUT, but also a high voltage input jack 43, a return jack 44 for insertion of a return lead, and a continuity/ground bond input jack 45. The high voltage jack enables the DUT to be connected to a dielectric withstand tester or insulation resistance tester through the adapter box 27 and a high voltage switching matrix (described below), while the continuity input to the switching matrix enables connection of the current lead of a ground bond tester to the ground lead of the DUT via the switching matrix.

FIG. 3 illustrates connections between the preferred run tester and a multifunction hipot tester 46 of the type described in U.S. Pat. No. 6,054,865, including respective connections of high voltage output jack 47 of the external tester to high voltage input 43, return 48 of the external tester to return jack 44, and current jack 50 of the external tester to continuity/ground bond jack 45 of the preferred tester. In addition, the female connector input 39 is connected to a corresponding signal output 51 of external tester 46 for locking the run tester and ensuring control of the high voltage tests via the control programs stored and run from the front panel (not shown) of the external tester. As a result of this arrangement, when it is desired to perform a high voltage safety compliance test before or after run testing, without disconnecting the DUT from the run tester, it is simply necessary to make the appropriate connections between the high voltage, return, and/or ground bond or current jacks of the respective testers and run the tests in the usual fashion through the control panel of the external tester.

The internal circuitry for the tester is illustrated in FIGS. 4–9, the overall layout being illustrated in FIG. 4. As illustrated therein, the run tester of the preferred embodiment includes a main control board 60, an input protection board 61 connected to the line input receptacle 34, a step down transformer 62, a keypad board 63, an LCD board 64, a bus remote interface board 65, and a switching matrix board 66. The main control board 60 includes a microprocessor and memory circuits, and is connected by busses or jumper cables to the various interface and power control boards. Operator input functions are provided by the keypad board 63, while the LCD drivers are provided on the separate LCD control board 64. The input protection board 61 and the step down transformer 62 supply power to the main control board, and from the main control board to the other boards, although power to the DUT is supplied by separate line and neutral inputs 41 and 42 directly through the switching matrix board 66.

Keypad board 63, illustrated in FIG. 5, includes circuitry 67 for generating electrical signals upon pressing of buttons or keys 4, 5, and 9–21 on the main panel illustrated in FIG. 1, and may further include the LED driver circuitry 68 shown in FIG. 6, although the LED driver circuitry may alternatively be included on a separate board, on the main control board, or on the LCD board. Keys KY14 to KY24 shown in FIG. 5 correspond to keys of the numeric keypad 9 illustrated in FIG. 1, while the remaining key and LED assignments are indicated by reference numerals 4, 5, and 10–21 which are described above in connection with FIG. 1. Both the power input lines 69 and the power output lines 70 of the keypad circuitry 67, and the power input lines to the LED circuitry 68, are connected directly to the main control board, with B0-B4 designating keypad input signals and C0-C4 designating keypad output signals.

It is noted that the "CN###" and "SCN###" designations included in the drawings, such as the CN1 designation included in the input and output sections of keypad circuitry 67, indicate termini of the cables connecting the various boards shown in FIG. 4. Similar cable terminus identifications are used throughout the drawings but will, in the interest of conciseness, not generally be mentioned further in this description although those skilled in the art can trace the necessary connections based on the terminal and line numbers shown in the drawings. As will be understood by those skilled in the art, cables come with a standard number of lines and not all of the available lines are used by the circuitry of the present invention.

Turning to FIG. 7, the input protection board 61 includes a line input 75, a neutral input 76, and a ground connection 77 connected via a standard power cord connector to a power outlet for receiving a 115 or 230 volt input line voltage. This voltage is filtered by resistor R1 and C1 and converted by power select switches 37 and impedance network 78 into a 115 volt output. The 115 volt output is supplied to jumper 80, which connects the input protection board to the step down transformer 62. Step down transformer 62 is a step down or potential transformer which converts the 115 volt input from the input protection board into low voltage outputs that are rectified by rectifier circuitry on the main circuit board 60; illustrated in FIG. 9, for powering integrated circuitry on the main control board and various devices such as the keypad and indicators. The transformer and rectifier circuitry are standard in appliances that utilizes line current and are therefor not described in detail herein.

Figure 8:
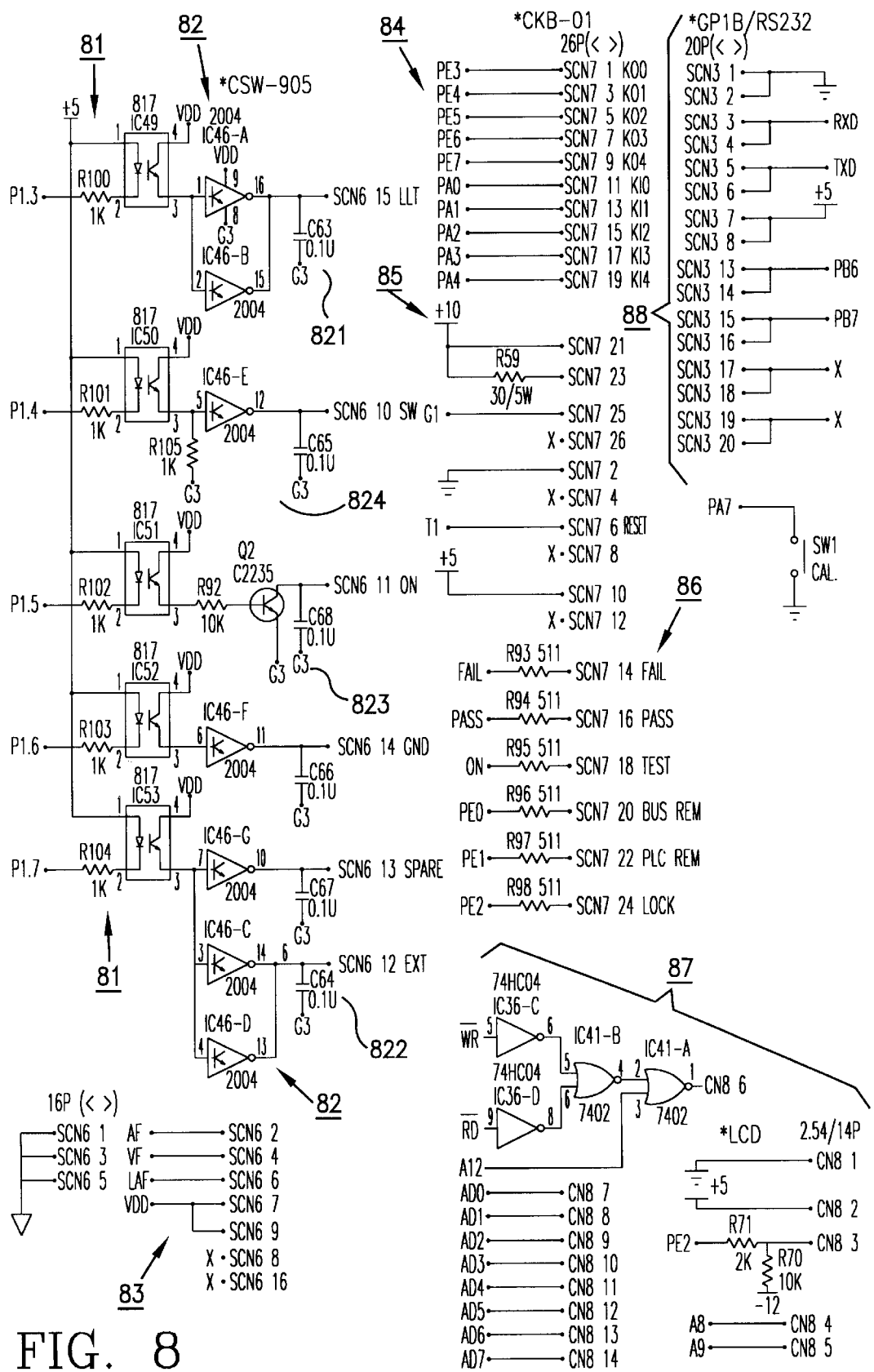
FIGS. 8 and 9 are schematic circuit diagrams of a portion of a main control board for use in the preferred run test instrument.

FIG. 8 shows the various interfaces included in the main control board 60 through which a microprocessor 100 (illustrated in FIG. 12) outputs control signals to the remaining boards, including output signals LLT, SW, ON, GND, and EXT for controlling switching between the various inputs and outputs of the run test instrument, as described below in connection with FIG. 10. Signals LLT, SW, ON, GND, and EXT are output to the high voltage switching matrix 66 through optical isolators 81 and open collector relay drivers 82 which make up respective microprocessor output circuits 821–824. Signals AF, VF, LAF, and VDD are supplied by lines 83 directly from the high voltage switching matrix board 66 to the main controller input circuitry shown in FIG. 11. Lines 84 are used to transmit signals to the keypad circuitry 67 while lines 84 connect the test and reset button to the main control board, and lines 85 connect the main control board to appropriate lines on the LED driver circuitry 68. Reference numeral 87 indicates control outputs to the LCD board, and reference numeral 88 indicates output lines to a standard GPIB or RS-232 bus interface board of the type described in detail in U.S. Pat. No. 6,054,865, incorporated by reference herein.

Figure 9:
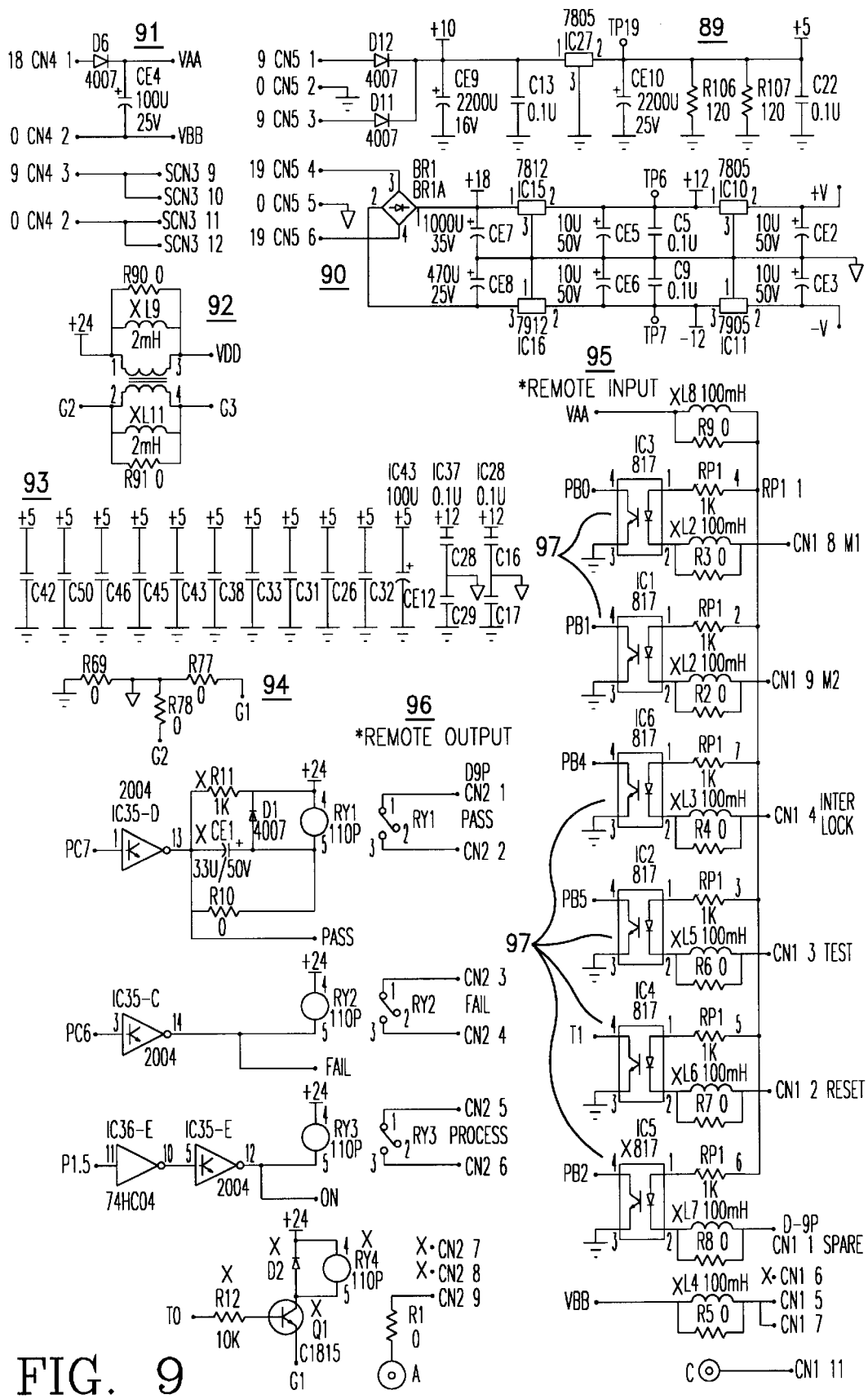

FIG. 9 shows the power conditioning circuits 89–94 for supplying power from the step down transformer to the main control board circuitry, the keypad board, and the LCD, as well as the remote input interface circuit 95 and remote output interface circuit 96. Included in the remote input circuitry are optical isolators 97 for receiving test and reset signals from an external instrument such as, for example, the hipot tester illustrated in FIG. 3, as well as an interlock signal that inverts the original reset logic on the instrument from normally opened to normally closed so that the contacts must be opened to effect a reset, enabling the run tester can be used with an external safety interlock device that utilizes a "fail-when-open" configuration on its output interface. Signals M1 and M2 are used to remotely select test programs stored in memory. The outputs, as indicated above, include pass, fail, and processing signals which can be used to control the display on the remote device, as well as to trigger the reset function, which preferably should remain active on both the run tester and the remote instrument so that reset can be activated from either location.

Figure 10:
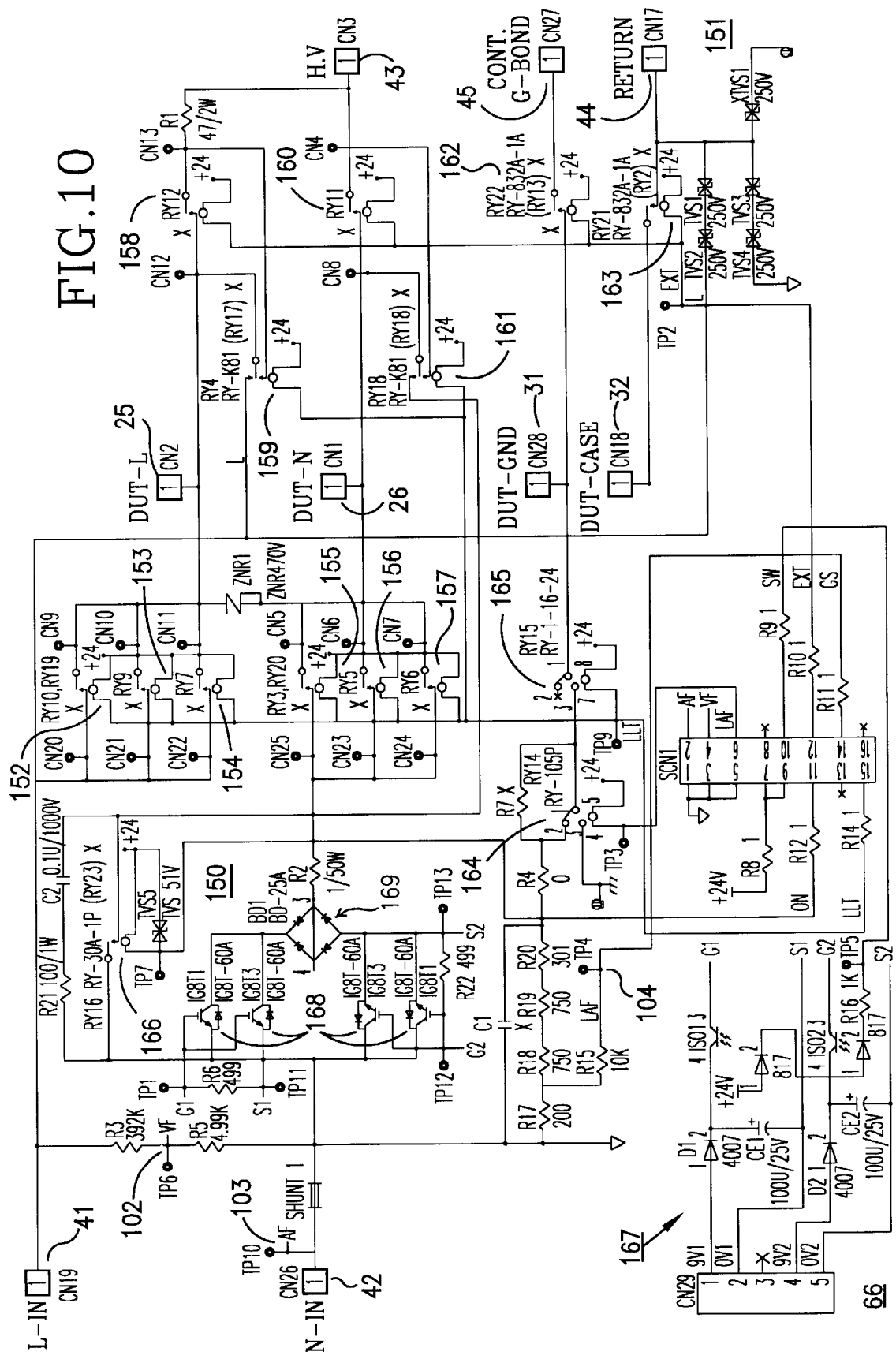
FIG. 10 is a schematic circuit diagram of a high voltage switching matrix board for use in the run test instrument of the preferred embodiment.

As shown in FIG. 10, connections to the device under test are routed through a high voltage switching board 66 including rectifier circuitry 150 made up of transistors 168, bridge-connected diodes 169, and relay 166; transient protection circuitry 151; switching relays 152–161 for respectively connecting line and neutral outputs 25,26 to AC line and neutral inputs 41,42 and high voltage input 43; switching relays 162,163 for respectively connecting ground output 31 and "case" output 32 to return input 44 and continuity/ground bond input current input 45; and switching relays 164 and 165 for connecting the line neutral input 42 to ground output terminal 31. Relay 166 is arranged to by-pass the solid state neutral switching provided by transistors 168 and resistor R2 after a zero-cross event has passed so as to avoid the need for heat sinks. Relays 152–157 also enable polarity reversal between the line and neutral inputs 41,42 and outputs 25,26. Outputs 25,26 and 31,32, and inputs 41–45 are all located on the rear panel of the run test instrument, as shown in FIG. 2.

Relays 152–157, 159, and 161 which enable selection of the line input are controlled by signal LLT output by microprocessor output circuit 821, while relays 158, 160, 162, and 163 which enable selection of the external high voltage or ground bond/continuity inputs, are controlled by signal EXT output by microprocessor output circuit 822. The rectifier circuit zero-cross switching by-pass relay 166 is controlled by an ON signal from microprocessor output circuit 824, while switching circuits 167 for transistor switches 168 of the rectifier circuit 150 are controlled by signal SW from microprocessor output circuit 823. Microprocessor output circuits 821–823 are illustrated in FIG. 8.

Figure 11:
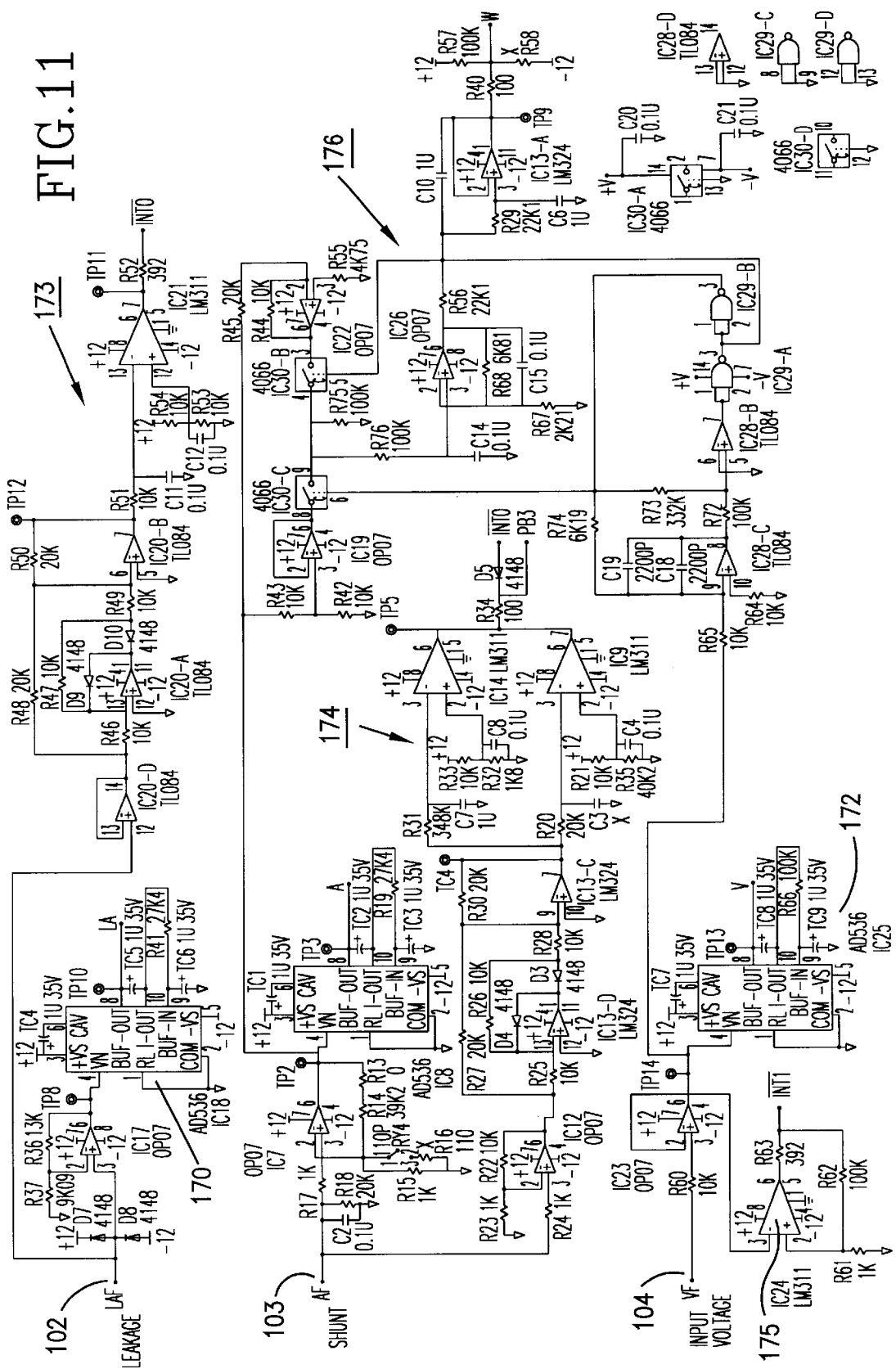
FIGS. 11 and 12 are schematic circuit diagrams of further portions of the main control board illustrated in FIGS. 8 and 9.

FIG. 11 shows the test result processing section of the main control board 60. Signals VF, AF, and LAF, which represent the leakage current, shunt voltage, and input voltage, are respectively measured at terminals 102–104 shown in FIG. 10 and supplied to RMS analog-to-digital converters 170,171,172 having respective digitized outputs LA, A, and V so that the test results can be displayed. In addition, the test results processing circuitry shown in FIG. 11 includes comparator circuits 173–176 for comparing the detected voltages with preset limits generating pass/fail interrupts INT0 and INT1, which are supplied directly to the microprocessor 100, and range indicator signal w (T0).

Figure 12:
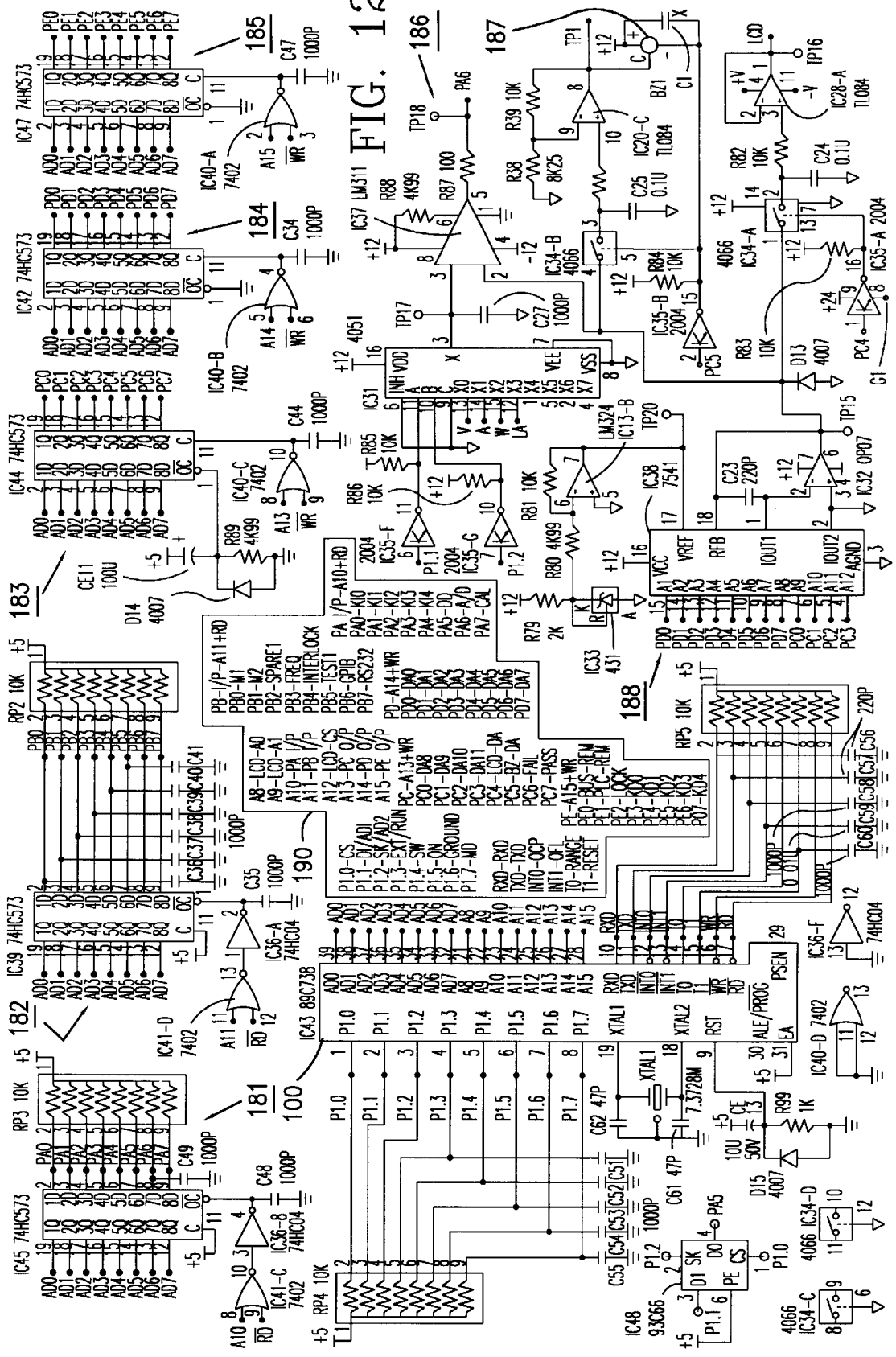

FIG. 12 shows the layout of the digital controller circuitry portion of the main control board 60. The main control functions are provided by microprocessor 100 connected to the measurement, control, and display circuitry through octal input latches 181, 182, output latches 183–185, multiplexer circuitry 186 for supplying alarm signals, including control of a buzzer 187, and digital-to-analog converter circuitry 138.

Although microprocessor 100 is illustrated as an 89C738 microprocessor, available from Royal Philips Electronics, it will he appreciated that other microprocessors may be substituted, with corresponding modifications to the main control board, in order to perform the functions of microprocessor 100, and that the invention is not to be limited to any particular microprocessor configuration. The pin assignments illustrated in table 190 included in FIG. 12 may of course be varied depending on the type of microprocessor selected, with programming of the selected microprocessor being carried out by the skilled artisan with reference to appropriate data sheets available from manufacturers of the microprocessor.

Having thus described a preferred embodiment of the invention in sufficient detail to enable those skilled in the art to make and use the invention, it will nevertheless be appreciated that numerous variations and modifications of the illustrated embodiment may be made without departing from the spirit of the invention, and it is intended that the invention not be limited by the above description or accompanying drawings, but that it be defined solely in accordance with the appended claims.

We claim:

1. An electrical run test instrument, comprising:
    an output connection to a device under test (DUT);
    two input terminals, including:
    (a) a high voltage input terminal arranged to receive a high voltage from at least one separate external safety compliance test instrument; and
    (b) an AC line voltage input terminal arranged to receive an AC line voltage;
    run test circuitry for receiving and processing run test measurements when the DUT is supplied with said AC line voltage; and
    a high voltage switching matrix arranged to selectively connect said AC line voltage input terminal and said high voltage terminal to said output connection,
    wherein:
    (a) when said high voltage input terminal is connected by said switching matrix to said output connection, the high voltage from said at least one separate external safety compliance test instrument is supplied to said DUT to perform safety compliance tests, and
    (b) when said AC line voltage input terminal is connected by said switching matrix to said output connection, (i) the AC line voltage is supplied to said DUT to perform said run tests, and (ii) said run test measurements are supplied to said run test circuitry by said switching matrix.

2. An electrical run test instrument as claimed in claim 1, wherein inputs to the high voltage switching matrix include at least a line voltage input connected to said AC line voltage input terminal, a line neutral input, a high voltage input connected to said high voltage input terminal, a ground bond/continuity input, and a high voltage/ground bond return, and wherein outputs from the high voltage switching matrix include a DUT line output, a DUT neutral output, an earth ground connection, and a connection to the DUT case or chassis.

3. A run test instrument as claimed in claim 2, wherein said high voltage switching matrix is further arranged to supply measurements of input voltage, output voltage, and output current to an analog-to-digital converter and to comparison circuitry on a main control board.

4. A run test instrument as claimed in claim 3, wherein switching between the various inputs and outputs is accomplished through relays controlled by a processor on the main control board.

5. A run test instrument as claimed in claim 1, further comprising a processor arranged to measure input voltage, amperage, power, and power factor of device under test running on line current.

6. A run test instrument as claimed in claim 1, further comprising circuitry arranged to measure a leakage current from an enclosure of the device under test to a neutral of the input line power.

7. A run test instrument as claimed in claim 1, further comprising an operator interface arranged to permit test parameters to be pre-programmed or set through a keypad accessible to a user of the instrument and a menu driven display screen.

8. A run test instrument as claimed in claim 1, further comprising a remote interface that permits pre-programmed test functions to be initiated through a remote input port, and pass/fail indicator functions to be reviewed via a remote output port in order to enable manual control of the instrument from a remote location.

* * * * *